(12) United States Patent
Kishi

(10) Patent No.: US 8,637,151 B2
(45) Date of Patent: Jan. 28, 2014

(54) INTERLAYER DIELECTRIC FILM WITH CARRIER MATERIAL AND MULTILAYER PRINTED CIRCUIT BOARD THEREWITH

(75) Inventor: Toyoaki Kishi, Tokyo (JP)

(73) Assignee: Sumitomo Bakelite Co., Ltd., Tokyo (JP)

( * ) Notice: Subject to any disclaimer, the term of this patent is extended or adjusted under 35 U.S.C. 154(b) by 545 days.

(21) Appl. No.: 12/524,161

(22) PCT Filed: Feb. 12, 2008

(86) PCT No.: PCT/JP2008/000201
§ 371 (c)(1),
(2), (4) Date: Jul. 23, 2009

(87) PCT Pub. No.: WO2008/099596
PCT Pub. Date: Aug. 21, 2008

(65) Prior Publication Data
US 2010/0032192 A1    Feb. 11, 2010

(30) Foreign Application Priority Data

Feb. 14, 2007 (JP) ................................ 2007-033045

(51) Int. Cl.
*B32B 15/00* (2006.01)
*H05K 1/00* (2006.01)

(52) U.S. Cl.
USPC ... 428/352; 428/209; 428/297.4; 428/355 EP; 428/356; 428/901; 174/258; 174/259; 361/748; 361/750; 361/751; 442/180; 442/348

(58) Field of Classification Search
USPC ....................... 428/209, 901, 297.4, 352, 356; 174/250–255, 258–259; 442/180, 348; 361/748, 750, 751
See application file for complete search history.

(56) References Cited

U.S. PATENT DOCUMENTS

| | | | | |
|---|---|---|---|---|
| 5,104,707 A | * | 4/1992 | Watanabe et al. | 428/40.9 |
| 5,346,750 A | * | 9/1994 | Hatakeyama et al. | 428/209 |
| 5,508,328 A | * | 4/1996 | Olson | 523/445 |
| 5,670,250 A | * | 9/1997 | Sanville et al. | 428/323 |
| 5,766,386 A | * | 6/1998 | Sakai et al. | 156/62.2 |
| 5,888,627 A | * | 3/1999 | Nakatani | 428/209 |
| 5,965,245 A | * | 10/1999 | Okano et al. | 428/209 |

(Continued)

FOREIGN PATENT DOCUMENTS

| | | |
|---|---|---|
| JP | 2000-244114 | 9/2000 |
| JP | 2004-050755 | 2/2004 |
| JP | 2004-284192 | 10/2004 |
| WO | WO 03/018675 | 3/2003 |

*Primary Examiner* — Cathy Lam
(74) *Attorney, Agent, or Firm* — Ditthavong Mori & Steiner, P.C.

(57) ABSTRACT

An objective of this invention is to provide an interlayer dielectric film with a carrier material used in a multilayer printed circuit board, which exhibits sufficient rigidity for a thin multilayer printed circuit board.
According to the present invention, there is provided an interlayer dielectric film with a carrier material comprising a carrier material comprised of a metal foil or resin film and an interlayer dielectric film formed on one side of the carrier material, wherein the interlayer dielectric film is comprised of a base material impregnated with a resin; the base material has a thickness of 8 µm to 20 µm; and when the resin is cured at 170° C. for one hour under a pressure of 30 kgf/cm$^2$, an elongation percentage of the interlayer dielectric film in a planar direction is 0.05% or less as determined by a TMA method.

7 Claims, 1 Drawing Sheet

(56) References Cited

U.S. PATENT DOCUMENTS

| | | | |
|---|---|---|---|
| 6,245,696 B1 * | 6/2001 | Haas et al. | 442/348 |
| 6,524,717 B1 * | 2/2003 | Takano et al. | 428/450 |
| 6,558,797 B1 * | 5/2003 | Arata et al. | 428/418 |
| 6,748,652 B2 * | 6/2004 | Andou et al. | 29/852 |
| 6,805,958 B2 * | 10/2004 | Nakamura et al. | 428/416 |
| 7,368,497 B2 * | 5/2008 | Hosomi et al. | 524/492 |
| 7,754,321 B2 * | 7/2010 | Yamane et al. | 428/297.4 |
| 7,790,268 B2 * | 9/2010 | Kennedy | 428/209 |
| 8,044,505 B2 * | 10/2011 | Hosomi et al. | 257/701 |
| 8,318,292 B2 * | 11/2012 | Ohigashi | 428/209 |
| 8,357,859 B2 * | 1/2013 | Wakabayashi et al. | 174/258 |
| 8,382,996 B2 * | 2/2013 | Narahashi et al. | 216/13 |
| 2009/0126974 A1 * | 5/2009 | Yuasa et al. | 174/250 |

* cited by examiner

US 8,637,151 B2

INTERLAYER DIELECTRIC FILM WITH CARRIER MATERIAL AND MULTILAYER PRINTED CIRCUIT BOARD THEREWITH

TECHNICAL FIELD

The present invention relates to an interlayer dielectric film with a carrier material and a multilayer printed circuit board with the film.

BACKGROUND ART

In the related art, a multilayer printed circuit board has been manufactured by impregnating a glass cloth base material with an epoxy resin, semi-curing the resin to prepare a prepreg sheet, placing one or more of the prepreg sheets on a circuit board with a circuit, further placing a copper foil on the sheet, and integrally molding the product under pressure using a hot-plate press. In this method, the step of stacking a prepreg containing a glass cloth and a copper foil are repeated multiple times. Thus, foreign matters may be incorporated in each step.

Recently, to solve these problems, a material free from a glass cloth in which an insulating resin layer is directly stacked on a copper foil known as Resin Coated Copper (RCC) has been used for manufacturing a multilayer printed circuit board. It allows for manufacturing a thin multilayer printed wiring board, so that demand for RCC has been significantly increased (see, for example, Patent Reference 1).

However, when such a material free from a base material such as a glass cloth is stacked by a conventional pressurizing procedure, the resin may flow out during stacking under heating and pressure. Therefore, it is difficult to precisely control a thickness of an insulating resin layer. Furthermore, the material is so thin that it cannot be easily handled and defects such as break and bending of the material may lead to a low yield and thus to a high cost. In addition, when another component is mounted on a printed circuit board prepared by stacking such an insulating resin layer, rigidity of the printed circuit board cannot be maintained due to the absence of a base material such as a glass cloth, so that warpage may occur in the printed circuit board, leading to defective connection between the component and the printed circuit board.

Patent Reference 1: Japanese Published Unexamined Application No. 2000-244114.

DISCLOSURE OF THE INVENTION

According to the present invention, there is provided an interlayer dielectric film with a carrier material comprising a carrier material comprised of a metal foil or resin film and an interlayer dielectric film on one side of the carrier material, wherein the interlayer dielectric film is comprised of a base material impregnated with a resin; the base material has a thickness of 8 μm to 20 μm; and when the resin is cured at 170° C. for one hour under a pressure of 30 kgf/cm$^2$, an elongation percentage of the interlayer dielectric film in a planar direction is 0.05% or less as determined by a TMA method.

An interlayer dielectric film with a carrier material of the present invention employs a base material with a thickness of 8 μm to 20 μm. Therefore, it can have improved rigidity in comparison with a material (RCC) made of a resin alone, resulting in improved reliability in component mounting.

In a preferred embodiment, when the resin is cured at 170° C. for one hour under a pressure of 30 kgf/cm$^2$, a storage elastic modulus of the interlayer dielectric film at 200° C. is 2 MPa to 20 MPa.

In a more preferable embodiment, the storage elastic modulus of the interlayer dielectric film at 200° C. is 30% to 80% of a storage elastic modulus of the interlayer dielectric film at room temperature. With the above configuration, when another component is mounted on a thin printed circuit board prepared by stacking such an interlayer dielectric film, deformation of the printed circuit board due to the weight of the component can be reduced. Furthermore, deformation of the printed circuit board due to a high temperature of 260° C. to 300° C. during mounting can be reduced.

According to the present invention, there is provided an interlayer dielectric film with a carrier material exhibiting sufficient rigidity to be used for manufacturing a thin multilayer printed circuit board.

BEST MODE FOR CARRYING OUT THE INVENTION

There will be detailed an interlayer dielectric film with a carrier material of the present invention and a multilayer printed circuit board with the film.

Figure 1:
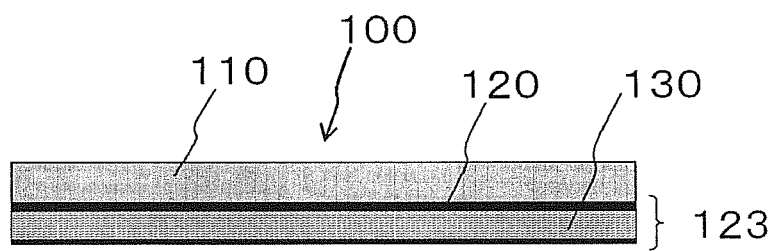
FIG. 1 is a schematic cross-sectional view of an interlayer dielectric film with a carrier material according to one embodiment of the present invention.

FIG. 1 is a cross-sectional view of an interlayer dielectric film with a carrier material according to one embodiment of the present invention. An interlayer dielectric film with a carrier material 100 has a carrier material 110 comprised of a metal foil or resin film and an interlayer dielectric film 123 formed in one side of the carrier material 110. The interlayer dielectric film 123 is comprised of a base material 130 impregnated with a resin 120, and this base material 130 has a thickness of 8 μm to 20 μm.

Examples of abase material used in the present invention include glass fibers such as glass woven fabrics and glass unwoven fabrics; inorganic fibers such as woven and unwoven fabrics containing an inorganic compound other than glass; and organic fibers such as aromatic polyamides, polyamides, aromatic polyesters, polyesters, polyimides and fluororesins. Among these base materials, a glass fiber base material represented by a glass woven fabric is preferable in the light of rigidity and strength during heating.

Examples of a carrier material as a metal foil or resin film in the present invention include metal foils such as copper and copper alloys, aluminum and aluminum alloys, iron and iron alloys and stainless steel, and resin films such as fluororesins, polyimides and polyesters (for example, polybutyrene terephthalate and polyethylene terephthalate).

Examples of a resin used in the present invention include epoxy resins and phenoxy resins. The use of these resins may lead to improvement in heat resistance of an interlayer dielectric film obtained.

Examples of an epoxy resin include, but not limited to, bisphenol-A epoxy resins, bisphenol-F epoxy resins, phenol novolac epoxy resins, cresol novolac epoxy resins, bisphenol-A novolac epoxy resins, naphthalene-modified epoxy resins, dicyclopentadiene-modified epoxy resins, aralkyl-modified epoxy resins and diaminodiphenylmethane-modified epoxy resins. Alternatively, a halogenated product of such an epoxy resin may be used for improving flame retardancy of an interlayer dielectric film obtained.

Such a halogenated epoxy resin may be, for example, a brominated epoxy resin with a bromination percentage of 20% or more, having a weight-average molecular weight of 10,000 to 30,000. The use of such a brominated phenoxy resin can reduce resin flowing when it is applied for a base material, so that a thickness of an interlayer dielectric film obtained can be maintained. Furthermore, such a brominated epoxy resin can allow for making the interlayer dielectric film flexible and improving flame retardancy of a multilayer printed circuit board prepared by stacking the interlayer dielectric film. Examples of such a halogenated epoxy resin or a phenoxy resin include brominated bisphenol-A type epoxy resins, brominated bisphenol-F type epoxy resins and brominated phenoxy resins. Among these, preferred are brominated bisphenol-A type epoxy resins and brominated phenoxy resins in the light of flame retardancy. Such a halogenated epoxy resin or phenoxy resin is used in 10% to 50% by weight in the total amount of the resin. With a content of more than 10% by weight, resin flowing can be reduced, a thickness of an interlayer dielectric film can be kept constant, and an inter-insulating-film thickness after stacking under press can be ensured. Meanwhile, with a content of less than 50% by weight, the resin can be easily applied to the base material 130 and concavity and convexity in a circuit during stacking under press can be filled.

For improving heat resistance of an interlayer dielectric film, it is preferable to use a cresol novolac epoxy resin. For reducing a dielectric tangent of an interlayer dielectric film, it is preferable to use a dicyclopentadiene-modified epoxy resin.

Epoxy resins which can be used in the present invention are not limited to these, and may be used alone or in combination of two or more.

When such a halogenated epoxy resin is used alone, a crosslink density after curing is low, leading to excessively higher flexibility. Furthermore, when it is dissolved in a solvent to prepare a resin varnish, a viscosity of the resin varnish is so increased that workability in applying it to a base material becomes insufficient. For solving such a drawback, an epoxy resin with an epoxy equivalent of 3000 or less is mixed. It is contained in 10 to 45% by weight to the total amount of the resin.

In the brominated epoxy resin or the brominated phenoxy resin, a bromination percentage is preferably 20% or more. When a bromination percentage is more than 20%, a resulting multilayer printed circuit board exhibits excellent flame retardancy, so that V-0 can be achieved. When a brominate depoxy resin is not used, flame retardancy of an interlayer dielectric film can be improved by mixing a novolac type epoxy resin and a phosphorous resin with a weight-average molecular weight of 1,000 to 5,000. For further improving flame retardancy, a flame-retardant inorganic filler may be incorporated in the resin.

A resin used in the present invention may further contain an epoxy resin curing agent. Examples of the epoxy resin curing agent include, but not limited to, amines, imidazoles, acid anhydrides and phenol resins. An amine is preferable used because it can, even in a small amount, sufficiently cure an epoxy resin and cause the resin flame retardant. Particularly preferred is an amine which has a melting point of 150° C. or higher and is, thus, a solid at an ambient temperature, is soluble in an organic solvent, has a small solubility in an epoxy resin, and can rapidly react with an epoxy resin at an elevated temperature of 150° C. or higher. Specific examples include dicyandiamide, diaminodiphenylmethane and diaminodiphenyl sulfone. Such an amine is dissolved in a solvent and homogeneously dispersed in an epoxy resin varnish. These amines are less compatibility with an epoxy resin. When the solvent is removed by evaporation, these amines are homogeneously dispersed in the epoxy resin varnish, so that the reaction does not proceed at a temperature from an ambient temperature to 100° C. Therefore, an epoxy resin varnish exhibiting excellent storage stability can be provided.

In an interlayer dielectric film with a carrier of the present invention, when a resin in the interlayer dielectric film is measured by TMA method after being cured at 170° C. for one hour under a pressure of 30 kgf/cm$^2$, an elongation percentage in a planar direction of the interlayer dielectric film is 0.05% or less.

In a preferable embodiment of the present invention, after the resin in the interlayer dielectric film is cured at 170° C. for one hour under a pressure of 30 kgf/cm$^2$, the interlayer dielectric film has a storage elastic modulus of at 200° C. of 2 MPa to 20 MPa. When a storage elastic modulus is within this range, components can be reliably connected because concaves in wire bonding are reduced.

Furthermore, a storage elastic modulus may be retained in a percentage of 30% to 80% at 200° C. to a storage elastic modulus at room temperature. When a retention rate is within the above range, components can be reliably mounted even on a thin printed circuit board without the circuit board being deformed by a component weight due to heat history from 260° C. to 300° C. during component mounting.

Besides the above materials, additional materials such as fused silica, crystalline silica, calcium carbonate, aluminum hydroxide, alumina, clay, barium sulfate, mica, talc, white carbon, aluminum borate and E-glass fine powder can be added in the amount of 1 to 45% by weight to the resin for improving an elastic modulus, a linear expansion coefficient, heat resistance, flame resistance and so on. When the amount is within this range, viscosity of an interlayer-insulating resin layer is so appropriate that its ability of burying the space between inner circuits is improved.

Further additives may be added, including a silan coupling agent such as an epoxy silan or a titanate coupling agent for improving adhesiveness to a metal foil and a circuit board and improving humidity resistance, an antifoaming agent for preventing voids, or a liquid or fine powder type flame retardant.

A solvent is selected from those which do not remain in a resin after applying a resin varnish to a base material and then drying it at 80° C. to 180° C. Examples of such a solvent include acetone, methyl ethyl ketone, toluene, xylene, n-hexane, methanol, ethanol, methyl cellosolve, ethyl cellosolve, methoxypropanol, cyclohexanone and N, N-dimethylformamide.

Next, there will be described one embodiment of a process for manufacturing an interlayer dielectric film with a carrier of the present invention.

Figure 2:
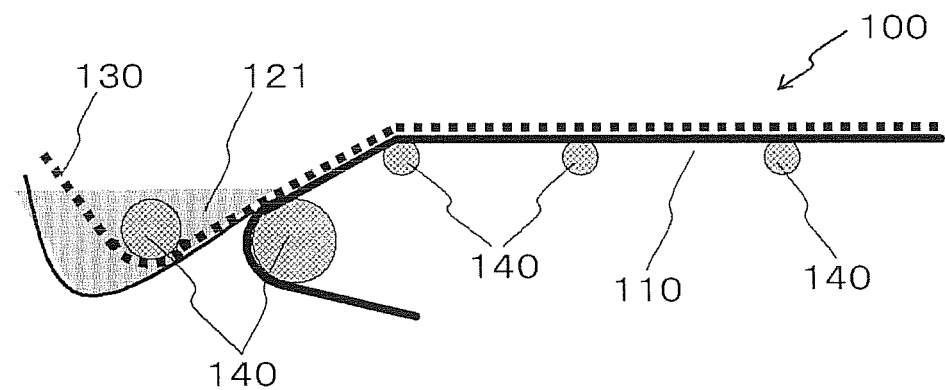
FIG. 2 is a schematic cross-sectional view illustrating a process for manufacturing an interlayer dielectric film with a carrier material according to one embodiment of the present invention.

As shown in the schematic cross section view of FIG. 2, an interlayer dielectric film with a carrier material 100 with a carrier material 110 and an interlayer dielectric film 123 can be manufactured as follows. First, a resin component is dissolved in a predetermined concentration in a solvent to obtain a resin varnish 121, and a glass woven fabric 130 as a base material is impregnated with the resin varnish 121. Then, while the unwanted resin is scraped off, the base material 130 is changed direction by rolls 140, and then stacked with the carrier material 110 such as a metal foil such that the base material is supported by the anchor side of the carrier material. Here, after the base material 130 is impregnated with the resin varnish 121, the base material 130 is supported by the carrier material 110 such that any stress is not applied to this base material 130. Thus, the interlayer dielectric film 123 with less distortion can be provided. In such the interlayer dielectric film with less distortion, dimensional variation is reduced during heating and pressing in the step of stacking and integration. Then, the resin is dried in a horizontal oven at 80° C. to 180° C. until the amount of volatile component in the resin becomes 1.5% by weight or less to the total weight of the resin, to prepare the interlayer dielectric film with the carrier material 100. Alternatively, the glass woven fabric 130 impregnated with the resin varnish 121 is continuously dried in a vertical oven at 80° C. to 180° C., and then the glass woven fabric 130 is sandwiched between the roughened side of the carrier material 110 such as a metal foil and a PET film, and those may be integrated by thermocompression bonding using heat rolls. Although any of these processes can be selected, the process using a horizontal oven in which a minimum tensility is applied to a glass woven fabric is preferable because the glass woven fabric is thin and low intensity.

When a carrier material is a metal foil in this interlayer dielectric film with the carrier material 100, the metal foil is processed into a predetermined wiring pattern, stacked on a circuit board, and the product is heated under pressure using a common vacuum press to cure the resin in the interlayer dielectric film 123, so that a multilayer printed circuit board having an outer-layer circuit can be easily formed.

When the carrier material of the carrier material 100 is a resin film, the resin film is peeled off before the interlayer dielectric film with a carrier material 100 is stacked on the circuit board. This interlayer dielectric film and the circuit board are stacked and the product is heated under pressure by a vacuum press to cure the interlayer dielectric film 123, so that a multilayer printed circuit board can be formed.

EXAMPLES

The present invention will be more specifically described with reference to Examples, but the present invention is not limited by these examples in any way.

Example 1

In methyl ethyl ketone (MEK) were dissolved 10 parts by weight of a brominated phenoxy resin (bromination percentage 25%, average molecular weight: 25000 to 30000) (hereinafter, the term, "parts" in a blending amount means parts by weight), 10 parts of a bisphenol-F type epoxy resin (epoxy equivalent: 175, Dainippon Ink And Chemicals, Incorporated, Epiclon 830), 20 parts of a bisphenol-A type epoxy resin (epoxy equivalent: 190, Japan Epoxy Resins Co., Ltd., 828), 25 parts of an ortho-cresol novolac type epoxy resin (epoxy equivalent: 220, Dainippon Ink And Chemicals, Incorporated, Epiclon N-690) and 30 parts of a naphthalene type epoxy resin (epoxy equivalent: 170, Dainippon Ink And Chemicals, Incorporated, HP-4700), and the mixture was blended. To this mixture were added 5 parts by weight of dicyandiamide as a curing agent, 0.3 parts by weight of an epoxysilane coupling agent (Nippon Unicar Co., Ltd., A-187) and 30 parts of aluminum hydroxide (HP-350, Showa Denko K. K.) to prepare a resin varnish.

The resin varnish thus obtained was applied to the roughened surface of a copper foil with a thickness of 12 μm. Separately, a glass woven fabric with a thickness of 15 μm was impregnated with the resin varnish. The glass woven fabric with resin-varnish was applied by a comma coater on the surface of the above copper foil with the resin varnish on which the resin varnish had been applied, and the product was continuously dried in a horizontal oven such that a thickness of the glass woven fabric with resin varnish became 30 μm, to provide an interlayer dielectric film with a copper foil having the B-staged interlayer dielectric film with a post-drying thickness of 30 μm. Here, the term, "B-staged" means that a reaction rate of an epoxy resin in a resin varnish impregnated in an interlayer dielectric film is 10% to 80%.

Next, a glass epoxy double-sided copper-clad lamination which is contains a glass fabric and epoxy resin with a base material thickness of 0.1 mm and a copper foil thickness of 35 μm was carried out patterning to obtain a circuit board. After the copper foil surface of this circuit board was blackened, the interlayer dielectric films with a copper foil prepared as above are stacked on both sides of the circuit board in such a way that the interlayer dielectric films are in contact with the circuit board.

The stacked product was sandwiched between two 1.6 mm stainless-steel patches, and was heated using a vacuum press under the conditions of heating to 150° C. at rise rate of 3° C./min to 10° C./min, a pressure of 10 to 30 Kg/cm$^2$, a vacuum degree of −760 to −730 mmHg, and then pressed at 150° C. for 15 min or longer, to prepare a multilayer printed circuit board with a thickness of 0.2 mm.

Example 2

A multilayer printed circuit board was manufactured as described in Example 1, substituting silica (Admatechs Co., Ltd., SO-25R) for aluminum hydroxide.

Example 3

A multilayer printed circuit board was manufactured as described in Example 1, except that 10 parts of a bisphenol-A type epoxy resin (epoxy equivalent: 190, Japan Epoxy Resins Co., Ltd., 828), 30 parts of an ortho-cresol novolac type epoxy resin (epoxy equivalent: 220, Dainippon Ink And Chemicals, Incorporated, Epiclon N-690) and 35 parts of a naphthalene type epoxy resin (epoxy equivalent: 170, Dainippon Ink And Chemicals, Incorporated, HP-4700) were used.

Example 4

A multilayer printed circuit board was manufactured as described in Example 1, except that 40 parts of a bisphenol-A type epoxy resin (epoxy equivalent: 190, Japan Epoxy Resins Co., Ltd., 828), 10 parts of an ortho-cresol novolac type epoxy resin (epoxy equivalent: 220, Dainippon Ink And Chemicals, Incorporated, Epiclon N-690) and 5 parts of a naphthalene type epoxy resin (epoxy equivalent: 170, Dainippon Ink And Chemicals, Incorporated, HP-4700) were used.

Example 5

A multilayer printed circuit board was manufactured as described in Example 1, except that 20 parts of a biphenyl type epoxy resin (epoxy equivalent: 166, Nippon Kayaku Co., Ltd., NC-3000H) was further added.

Example 6

A multilayer printed circuit board was manufactured as described in Example 1, except that 60 parts of aluminum borate (YS-3A) was added as an inorganic filler, and 30 parts by weight of a brominated phenoxy resin (bromination percentage: 25%, average molecular weight: 25,000 to 30,000) (hereinafter, the term, "parts" in a blending amount means parts by weight) and 10 parts of a bisphenol-F type epoxy resin (epoxy equivalent: 175, Dainippon Ink And Chemicals, Incorporated, Epiclon 830) were used, and a curing agent and a hardening accelerator were used.

Comparative Example 1

A prepreg with a copper foil was prepared as described in Example 1, using a common prepreg with a thickness of 0.06 mm (base material thickness: 0.05 mm) and a copper foil with a thickness of 12 μm. A multilayer printed circuit board was manufactured using this prepreg with a copper foil and a circuit board as described in Example 1.

The interlayer dielectric films thus obtained were evaluated for a storage elastic modulus (200° C.), a retention rate of a storage elastic modulus and an elongation percentage in a planar direction, and a deflection of a multilayer printed circuit board under load. The results are shown in Table 1.

TABLE 1

|  | Example 1 | Example 2 | Example 3 | Example 4 |
|---|---|---|---|---|
| Storage elastic modulus of an interlayer dielectric film (200° C.) | 5 MPa | 12 MPa | 8 MPa | 5 MPa |
| Retention rate of a storage elastic modulus of an interlayer dielectric film | 30% | 40% | 40% | 40% |
| Elongation percentage of an interlayer dielectric film in X-direction | 0.05% | 0.04% | — | — |
| Elongation percentage of an interlayer dielectric film in Y-direction | 0.05% | 0.04% | — | — |
| Elongation percentage of an interlayer dielectric film in a planar direction | 0.05% | 0.04% | — | — |
| Deflection of a multilayer printed circuit board under load | 0.5 mm or less | 0.5 mm or less | 0.5 mm or less | 0.5 mm or less |

|  | Example 5 | Example 6 | Comparative Example 1 |
|---|---|---|---|
| Storage elastic modulus of an interlayer dielectric film (200° C.) | 5 MPa | 22 MPa | 1 MPa |
| Retention rate of a storage elastic modulus of an interlayer dielectric film | 20% | 70% | 10% |
| Elongation percentage of an interlayer dielectric film in X-direction | — | 0.02% | 0.10% |
| Elongation percentage of an interlayer dielectric film in Y-direction | — | 0.02% | 0.10% |
| Elongation percentage of an interlayer dielectric film in a planar direction | — | 0.02% | 0.10% |
| Deflection of a multilayer printed circuit board under load | 0.5 mm or less | 0.5 mm or less | more than 0.5 mm |

Measuring Procedures

1. Preparation of an Interlayer Dielectric Film

An interlayer dielectric film with a copper foil having a B-staged interlayer dielectric film prepared as described above was cut into a 350 mm×350 mm (X-direction×Y-direction) piece, which was then heated at 170° C. for 1 hour under a pressure of 30 kgf/cm$^2$, to give a C-staged interlayer dielectric film. Here, the term, "C-staged" means that a reaction rate of an epoxy resin in a resin varnish is more than 90%. This interlayer dielectric film with a copper foil having a C-staged interlayer dielectric film was cut into a 5 mm×20 mm (X-direction×Y-direction) piece. Then, the copper foil in the interlayer dielectric film with a copper foil was etched off to give a test piece of an interlayer dielectric film with a thickness of 30 μm. Here, X-direction is a longitudinal axis direction of an interlayer dielectric film with a copper foil and Y-direction is a width direction of an interlayer dielectric film with a copper foil.

2. Storage Elastic Modulus of an Interlayer Dielectric Film

The test piece of an interlayer dielectric film prepared in "1" was subjected to measurement by a dynamic thermal analysis instrument (TA Instruments Japan, DMA, 5° C./min) at 200° C.

3. Retention Rate of a Storage Elastic Modulus of an Interlayer Dielectric Film

The test piece of an interlayer dielectric film prepared in "1" was subjected to measurement by a dynamic thermal analysis instrument (TA Instruments Japan, DMA, 5° C./min) at 200° C. and room temperature (20 to 25° C.). A retention rate was calculated from a storage elastic modulus at 200° C. (a) and a storage elastic modulus at room temperature (b) as [(a)/(b)]×100(%).

4. Elongation Percentage of an Interlayer Dielectric Film in a Planar Direction

An elongation percentage was measured by a TMA method for the test piece of an interlayer dielectric film prepared in "1". Specifically, using a thermal analysis instrument from TA Instruments Japan, an elongation percentage was measured from 50° C. to 260° C. under the conditions of a tensile load of 10 g and a temperature-increase rate of 0° C./min. An elongation percentage in X-direction was calculated as [(Dimension in X-direction after loading)/(Dimension in X-direction before loading]×100(%). An elongation percentage in Y-direction was also determined in a similar manner. An elongation percentage in a planar direction was calculated as an average of the elongation percentages in X-direction and in Y-direction.

5. Deflection of a Multilayer Printed Circuit Board Under Load

For the multilayer printed circuit board obtained above, a deflection under load from above was measured under the conditions of a temperature of 200° C., a load of 10 g (constant), an inter-chuck distance of 10 mm and a cross-head rate of 0.5 mm/min, using 5t Tensilon from Orientec Co., Ltd.

The invention claimed is:

1. An interlayer dielectric film with a carrier material, comprising:
   a carrier material including a metal foil or a resin film and having a surface; and
   an interlayer dielectric film provided on the surface of said carrier material, comprising:
      a base material having a thickness of 8 μm to 20 μm; and
      a resin impregnated into the base material, the resin having a property so as to make the interlayer dielectric film have an elongation percentage in a planar direction of 0.05% or less as determined from 50° C. to 260° C. by a thermomechanical analysis method when the resin is impregnated into the base material and cured at 170° C. for one hour under a pressure of 30 kgf/cm$^2$, and the resin containing a bisphenol-A epoxy resin or a bisphenol-F epoxy resin, and a naphthalene epoxy resin.

2. The interlayer dielectric film with a carrier material as claimed in claim 1, wherein said base material is a glass woven fabric.

3. The interlayer dielectric film with a carrier material as claimed in claim 1, wherein said resin contains an inorganic filler.

4. The interlayer dielectric film with a carrier material as claimed in claim 1, wherein said resin is in a state of B-staged.

5. A multilayer printed circuit board manufactured by stacking the interlayer dielectric film with a carrier material as claimed in claim 1, wherein said carrier material comprises of a metal foil.

6. A multilayer printed circuit board manufactured by a process comprising:
   providing the interlayer dielectric film with a carrier material as claimed in claim 1, the carrier material comprising a resin film;
   peeling off the carrier material from the interlayer dielectric film; and
   stacking the interlayer dielectric film on a circuit board.

7. The interlayer dielectric film with a carrier material as claimed in claim 1, wherein said resin further contains at least one resin selected from the group consisting of a brominated phenoxy resin, an ortho-cresol novolac epoxy resin and a biphenyl epoxy resin.

\* \* \* \* \*